US011533003B2

(12) United States Patent
Jin et al.

(10) Patent No.: US 11,533,003 B2
(45) Date of Patent: Dec. 20, 2022

(54) PIEZOELECTRIC DEVICE INCLUDING DISPLACEMENT AMPLIFICATION OF SCISSOR-HINGE STRUCTURE

(71) Applicant: Electronics and Telecommunications Research Institute, Daejeon (KR)

(72) Inventors: Hanbit Jin, Daejeon (KR); Hye Jin Kim, Daejeon (KR); Yun-Jeong Kim, Daejeon (KR); YuLim Min, Daejeon (KR); Wooseup Youm, Daejeon (KR); JoonMin Lee, Daejeon (KR); Chan-Hwa Hong, Sejong-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 4 days.

(21) Appl. No.: 17/237,653

(22) Filed: Apr. 22, 2021

(65) Prior Publication Data
US 2021/0384848 A1    Dec. 9, 2021

(30) Foreign Application Priority Data

Jun. 8, 2020  (KR) .......................... 10-2020-0068769

(51) Int. Cl.
*H02N 2/04* (2006.01)
*H02N 2/00* (2006.01)
(Continued)

(52) U.S. Cl.
CPC ......... *H02N 2/043* (2013.01); *H01L 41/0986* (2013.01); *H02N 2/0055* (2013.01); *H02N 2/186* (2013.01); *H02N 2/22* (2013.01)

(58) Field of Classification Search
CPC ...... H02N 2/043; H02N 2/0055; H02N 2/186; H02N 2/22; H01L 41/0986
See application file for complete search history.

(56) References Cited

U.S. PATENT DOCUMENTS

| 6,346,710 B1* | 2/2002 | Ue .......................... H02N 2/028 250/311 |
| 7,567,017 B2 | 7/2009 | Yoon et al. |

(Continued)

FOREIGN PATENT DOCUMENTS

| CN | 108712103 | 10/2018 |
| KR | 10-0698438 | 3/2007 |

(Continued)

OTHER PUBLICATIONS

Mikio Muraoka et al., "Displacement amplifier for piezoelectric actuator based on honeycomb link mechanism", Sensors and Actuators A: Physical, 2010, pp. 84-90, vol. 157.

(Continued)

*Primary Examiner* — Emily P Pham
(74) *Attorney, Agent, or Firm* — Kile Park Reed & Houtteman PLLC

(57) ABSTRACT

The present disclosure relates to a piezoelectric device, and more particularly, to a piezoelectric device including: a piezoelectric actuator; a displacement transmission structure disposed on the piezoelectric actuator; and a displacement amplification structure disposed between the piezoelectric actuator and the displacement transmission structure. Here, the displacement amplification structure includes: a first displacement amplification structure and a second displacement amplification structure, which cross each other; and a fixing pin that passes through the first displacement amplification structure and the second displacement amplification structure to connect the first displacement amplification structure and the second displacement amplification structure. Also, each of one end of the first displacement amplification structure and one end of the second displacement amplification structure may be fixed on the piezoelectric actuator.

15 Claims, 11 Drawing Sheets

(51) Int. Cl.
  *H01L 41/09* (2006.01)
  *H02N 2/18* (2006.01)

(56) References Cited

U.S. PATENT DOCUMENTS 10,147,869 B2    12/2018   Kim et al.
10,598,558 B2     3/2020   Kim et al.

FOREIGN PATENT DOCUMENTS

KR      10-0735823        7/2007
KR   10-2019-0049707      5/2019
KR      10-2020269        9/2019

OTHER PUBLICATIONS

Yan Ding et al., "Design and analysis of a displacement amplifier with high load capacity by combining bridge-type and Scott-Russell mechanisms", Review of Scientific Instruments, 90, published online Jun. 4, 2019, 9 pages.

* cited by examiner

PIEZOELECTRIC DEVICE INCLUDING DISPLACEMENT AMPLIFICATION OF SCISSOR-HINGE STRUCTURE

CROSS-REFERENCE TO RELATED APPLICATIONS

This U.S. non-provisional patent application claims priority under 35 U.S.C. § 119 of Korean Patent Application No. 10-2020-0068769, filed on Jun. 8, 2020, the entire contents of which are hereby incorporated by reference.

BACKGROUND

The present disclosure herein relates to a piezoelectric device, and more particularly, to a piezoelectric device including a displacement amplification structure.

A piezoelectric actuator has an advantage such as low power consumption with low voltage driving, fast response, accuracy, high generation rate, and wide frequency band, but has a disadvantage in that a displacement is small in comparison with an electromagnet-type actuator, and high displacement is hardly obtained at low voltage driving. Thus, various researches are performed to provide the piezoelectric device generating high displacement even at low voltage driving.

SUMMARY

The present disclosure provides a piezoelectric device capable of performing high displacement operation even at low voltage driving to effectively transmit vibration.

The object of the present invention is not limited to the aforesaid, but other objects not described herein will be clearly understood by those skilled in the art from descriptions below.

An embodiment of the inventive concept provides a piezoelectric device including: a piezoelectric actuator; a displacement transmission structure disposed on the piezoelectric actuator; and a displacement amplification structure disposed between the piezoelectric actuator and the displacement transmission structure. Here, the displacement amplification structure includes: a first displacement amplification structure and a second displacement amplification structure, which cross each other; and a fixing pin that passes through the first displacement amplification structure and the second displacement amplification structure to connect the first displacement amplification structure and the second displacement amplification structure. Also, each of one end of the first displacement amplification structure and one end of the second displacement amplification structure is fixed on the piezoelectric actuator.

In an embodiment, the fixing pin may pass through each of the first displacement amplification structure and the second displacement amplification structure at a first point at which the first displacement amplification structure and the second displacement amplification structure cross each other.

In an embodiment, the piezoelectric device may further include: a first moving part bonded to the other end of the first displacement amplification structure; a second moving part bonded to the other end of the second displacement amplification structure; and a rail plate disposed on the first moving part and the second moving part.

In an embodiment, the rail plate may have a plurality of grooves extending from the first moving part to the second moving part on a bottom surface thereof.

In an embodiment, the rail plate may have a plurality of grooves on a bottom surface thereof, and the grooves define a movement path of each of the first moving part and the second moving part.

In an embodiment, the piezoelectric device may further include a rail plate disposed between the displacement amplification structure and the displacement transmission structure, and a first angle between the first displacement amplification structure and a bottom surface of the rail plate may be equal to a second angle between the second displacement amplification structure and the bottom surface of the rail plate.

In an embodiment, a first distance from the fixing pin to the one end of the first displacement amplification structure may be less than a second distance from the fixing pin to the other end of the first displacement amplification structure.

In an embodiment, the displacement transmission structure may include a flat part parallel to a top surface of the piezoelectric actuator and a protruding part that protrudes from the flat part.

In an embodiment, a vertical cross-section of the protruding part may have a polygonal shape, a semispherical shape, or a semielliptical shape.

In an embodiment, the piezoelectric actuator may include a first piezoelectric actuator and a second piezoelectric actuator, which are horizontally spaced apart from each other. Here, the one end of the first displacement amplification structure may be fixed to the first piezoelectric actuator, and the one end of the second displacement amplification structure may be fixed to the second piezoelectric actuator.

In an embodiment, the first piezoelectric actuator and the second piezoelectric actuator may not be electrically connected to each other and are configured to vibrate independently.

In an embodiment, the second displacement amplification structure may include a first portion and one pair of second portions, and an angle between the one pair of second portions may be in a range from about 90° to about 180°.

In an embodiment, the piezoelectric device may further include a rail plate disposed between the second displacement amplification structure and the displacement transmission structure. Here, an angle between one of the second portions of the second displacement amplification structure, which is adjacent to the rail plate, and the rail plate may be in a range from about 45° to about 90°, and an angle between the other of the second portions of the second displacement amplification structure, which is adjacent to the piezoelectric actuator, and the piezoelectric actuator may be in a range from about 10° to about 45°.

In an embodiment, the piezoelectric device may further include: a lower rail plate disposed on a bottom surface of the piezoelectric actuator and including a plurality of grooves; and a lower displacement amplification structure disposed between the lower rail plate and the piezoelectric actuator. Here, the lower displacement amplification structure may include a first lower displacement amplification structure and a second lower displacement amplification structure, which cross each other, and one end of the first lower displacement amplification structure and one end of the second lower displacement amplification structure may be fixed on the bottom surface of the piezoelectric actuator.

In an embodiment, the piezoelectric device may further include: a third moving part bonded to the other end of the first lower displacement amplification structure; and a fourth moving part bonded to the other end of the second lower displacement amplification structure, and each of the third moving part and the fourth moving part may move along the grooves of the lower rail plate.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
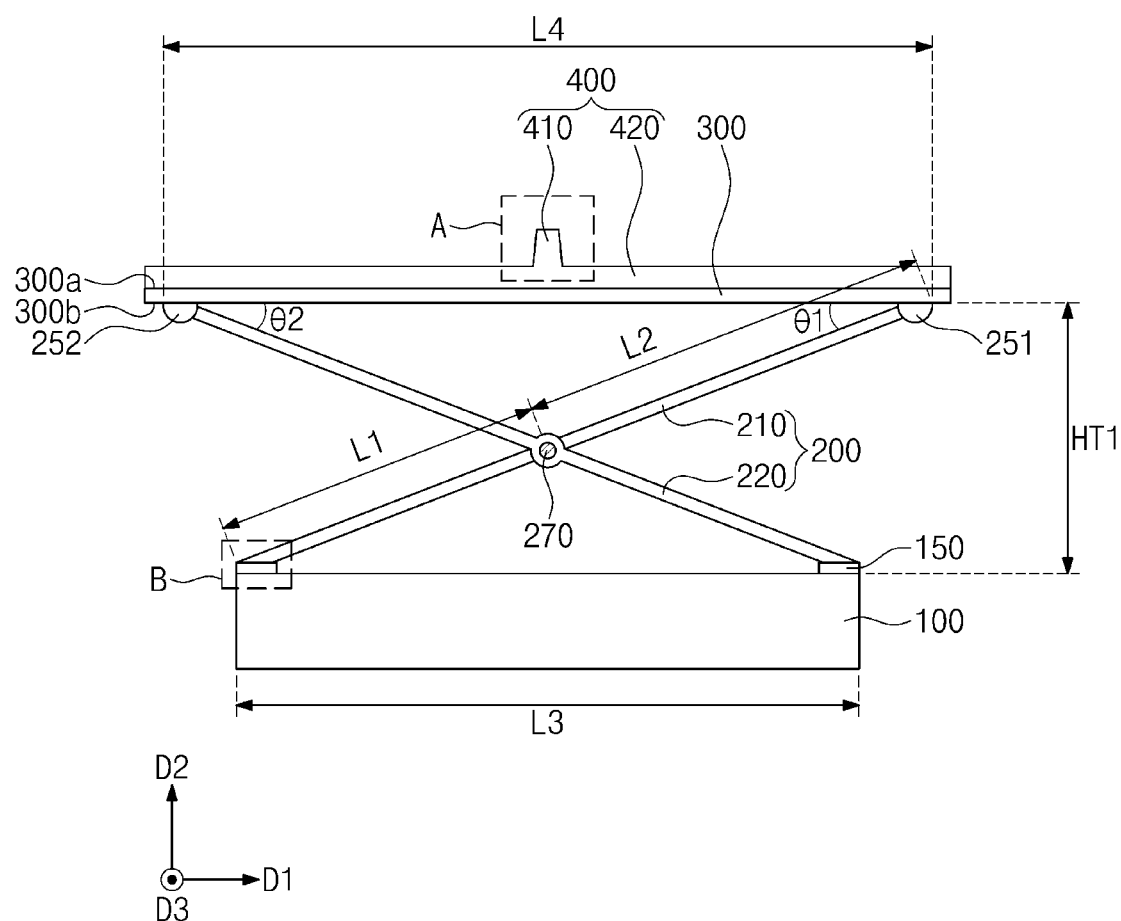
FIG. 1A is a cross-sectional view for explaining a piezoelectric device according to an embodiment of the inventive concept.

Advantages and features of the present invention, and implementation methods thereof will be clarified through following embodiments described with reference to the accompanying drawings. The present invention may, however, be embodied in many different forms and should not be construed as being limited to the embodiments set forth herein. Rather, these embodiments are provided so that this disclosure will be thorough and complete, and will fully convey the concept of the invention to those skilled in the art. Further, the present invention is only defined by scopes of claims. Like reference numerals refer to like elements throughout.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the present invention. Also, in the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region having a right angle illustrated in the drawings may have a round shape or a shape having a predetermined curvature. Areas exemplified in the drawings have general properties, and are used to illustrate a specific shape of a semiconductor package region. Thus, this should not be construed as limited to the scope of the present invention.

Hereinafter, a piezoelectric device according to an embodiment of the inventive concept will be described in detail.

FIG. 1A is a cross-sectional view for explaining a piezoelectric device according to an embodiment of the inventive concept.

Referring to FIG. 1A, the piezoelectric device according to an embodiment of the inventive concept may include a piezoelectric actuator 100, a displacement amplification structure 200, fixing parts 150, a first moving part 251, a second moving part 252, a rail plate 300, and a displacement transmission structure 400.

The piezoelectric actuator 100 may be provided. An electric field may be applied to the piezoelectric actuator 100. The piezoelectric actuator 100 may vibrate while repeating contraction and expansion by the applied electric field. A direction of the vibration may be parallel to a first direction D1 or an opposite direction of the first direction D1. The first direction D1 may be parallel to a top surface of the piezoelectric actuator 100. A third direction D3 may be perpendicular to the first direction D1 and parallel to the top surface of the piezoelectric actuator 100. A second direction D2 may be perpendicular to each of the first direction D1 and the third direction D3.

The displacement amplification structure 200 may be provided on the piezoelectric actuator 100. The displacement amplification structure 200 may be disposed between the piezoelectric actuator 100 and the displacement transmission structure 400. The displacement amplification structure 200 may include a first displacement amplification structure 210, a second displacement amplification structure 220, and a fixing pin 270. The first displacement amplification structure 210 and the second displacement amplification structure 220 may cross each other. The fixing pin 270 may pass through the first displacement amplification structure 210 and the second displacement amplification structure 220 to connect the first displacement amplification structure 210 and the second displacement amplification structure 220. Hereinafter, the displacement amplification structure 200 will be described in detail with reference to FIGS. 3A to 3C in conjunction with FIG. 2.

Figure 1B:
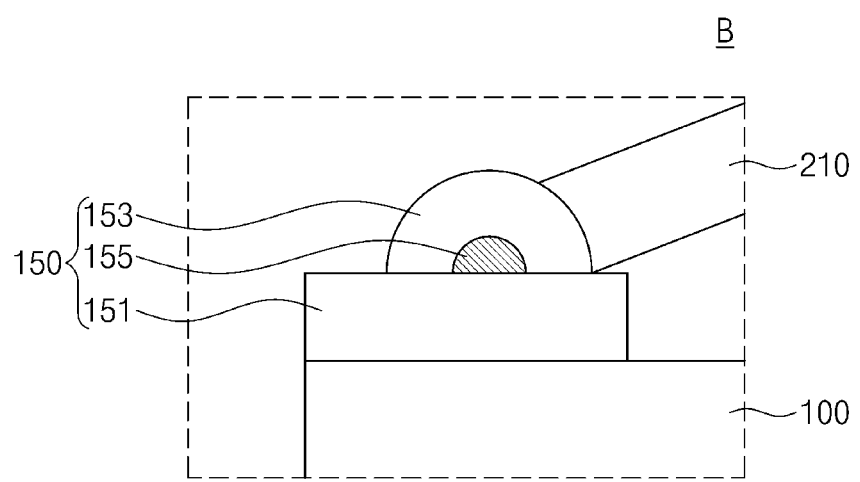
FIG. 1B is an enlarged view illustrating area B of FIG. 1A for explaining fixing parts of the piezoelectric device according to embodiments.
Figure 3A:
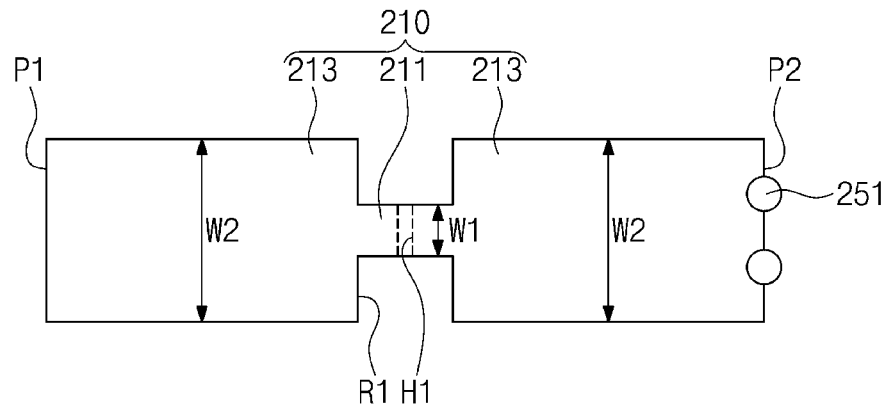
FIGS. 3A and 3B are plan views for explaining a displacement amplification structure of the piezoelectric device according to an embodiment.
Figure 3B:
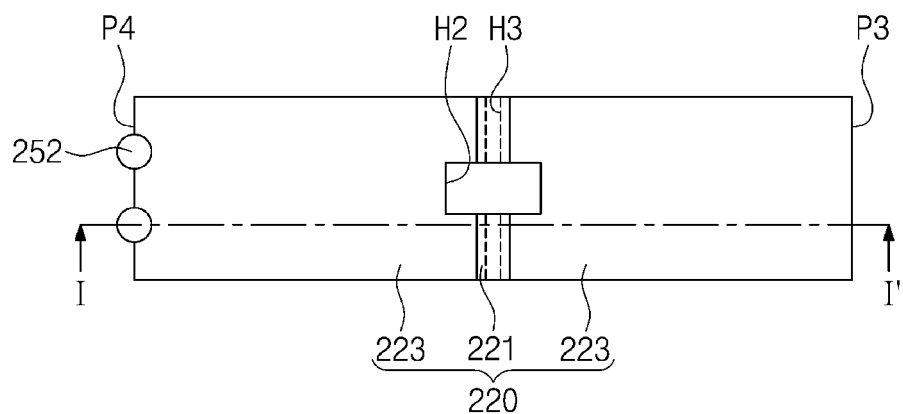
Figure 3C:
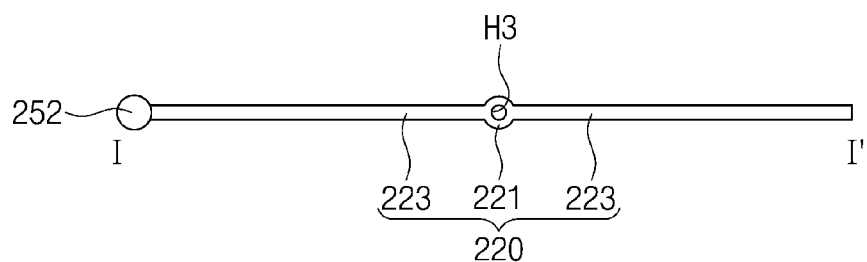
FIG. 3C is a cross-sectional view taken along line I-I' of FIG. 3B.

FIGS. 3A and 3B are plan views for explaining the displacement amplification structure of the piezoelectric device according to an embodiment. FIG. 3C is a cross-sectional view taken along line I-I' of FIG. 3B. FIG. 1B is an enlarged view illustrating area B of FIG. 1A for explaining the fixing parts of the piezoelectric device according to embodiments.

Referring to FIG. 3A in conjunction with FIG. 1A, the first displacement amplification structure 210 may include a first portion 211 and one pair of second portions 213. In terms of a plane, the first portion 211 may be disposed between the one pair of second portions 213. The first portion 211 may have a width W1 less than each of widths W2 of the second portions 213. The first displacement amplification structure 210 may have first grooves R1. The first grooves R1 may be provided such that one pair of side surfaces, which face each other, of the first displacement amplification structure 210 are recessed to a central portion thereof. The first portion 211 may be provided between the first grooves R1. The first displacement amplification structure 210 may have a first hole H1. The first hole H1 may pass through the first portion 211. More particularly, the first hole H1 may pass through the first portion 211 in a direction parallel to one end P1 and the other end P2 of the first displacement amplification structure 210. The one end P1 of the first displacement amplification structure 210 may be fixed to the piezoelectric actuator 100 through the fixing parts 150. The first moving part 251 may be disposed at the other end P2 of the first displacement amplification structure 210. More particularly, the first moving part 251 may be bonded to the other end P2 of the first displacement amplification structure 210. The first moving part 251 may have a globular shape, e.g., a wheel. The first moving part 251 may be provided in plurality. However, the single first moving part 251 will be described for convenience of description.

Referring to FIGS. 3A and 3C in conjunction with FIG. 1A, the second displacement amplification structure 220 may include a first portion 221 and one pair of second portions 223. In terms of the plane, the first portion 221 may be disposed between the one pair of second portions 223. The second displacement amplification structure 220 may have a second hole H2. In terms of the plane, the second hole H2 may vertically pass through a central portion of the second displacement amplification structure 220 More particularly, the second hole H2 may pass through at least a portion of the first portion 221 and at least a portion of the one pair of second portions 223. The second displacement amplification structure 220 may have a third hole H3. The third hole H3 may pass through the first portion 221. More particularly, the third hole H3 may pass through the first portion 211 in a direction parallel to one end P3 and the other end P4 of the second displacement amplification structure 220. The one end P1 of the first displacement amplification structure 220 may be fixed to the piezoelectric actuator 100 through the fixing parts 150. The second moving part 252 may be disposed at the other end P4 of the second displacement amplification structure 220. The second moving part 252 may be substantially the same as the above-described first moving part 251.

Referring to FIG. 1A again, the first displacement amplification structure 210 and the second displacement amplification structure 220 may be coupled to each other through the fixing pin 270. The first displacement amplification structure 210 and the second displacement amplification structure 220 may cross each other in a X-shape. A first angle θ1 between the first displacement amplification structure 210 and a bottom surface 300b of the rail plate 300 may be equal to a second angle θ2 between the second displacement amplification structure 220 and the bottom surface 300b of the rail plate 300. Each of the first angle θ1 and the second angle θ2 may be an acute angle. For example, each of the first angle θ1 and the second angle θ2 may be in a range from about 2.5° to about 45°. The first portion 211 of the first displacement amplification structure 210 may be disposed in the second hole H2 of the second displacement amplification structure 220. The first hole H1 of the first displacement amplification structure 210 may be aligned to the third hole H3 of the second displacement amplification structure 220. The fixing pin 270 may pass through each of the first displacement amplification structure 210 and the second displacement amplification structure 220. More particularly, the fixing pin 270 may be disposed in the first hole H1 of the first displacement amplification structure 210 and the third hole H3 of the second displacement amplification structure 220. Thus, the first displacement amplification structure 210 and the second displacement amplification structure 220 may cross each other and be connected by the fixing pin 270.

The fixing parts 150 may be disposed on the piezoelectric actuator 100. According to an embodiment, the fixing parts 150 may include, e.g., an adhesive resin or a metal material. However, the embodiment of the inventive concept is not limited to the material of the fixing parts 150. For example, the fixing parts 150 may include various materials capable of fixing the displacement amplification structure 200 to the piezoelectric actuator 100. The fixing parts 150 may fix the displacement amplification structure 200 on the piezoelectric actuator 100. More particularly, the fixing parts 150 may fixe the one end P1 of the first displacement amplification structure 210 and the one end P3 of the second displacement amplification structure 220 to the piezoelectric actuator 100. Thus, when the piezoelectric actuator 100 vibrates, the displacement amplification structure 200 also may vibrate together.

Referring to FIG. 1B, the fixing parts 150 according to an embodiment may have a hinge structure capable of adjusting an angle. More particularly, each of the fixing parts 150 may have a first portion 151, a second portion 153, and a third portion 155. The first portion 151 may be disposed on the piezoelectric actuator 100 and bonded to the top surface of the piezoelectric actuator 100. The second portion 153 may be fixed to the first portion 151 and overlap the one end of the first displacement amplification structure 210 and the one end of the second displacement amplification structure 220. The third portion 155 may pass through the one end of the first displacement amplification structure 210 and the second portion 153 or the one end of the second displacement amplification structure 220 and the second portion 153. The third portion 155 may have a pin shape. Thus, when the piezoelectric actuator 100 vibrates, an angle between the top surface of the piezoelectric actuator 100 and each of the first displacement amplification structure 210 and the second displacement amplification structure 220 may be easily changed.

Figure 4A:
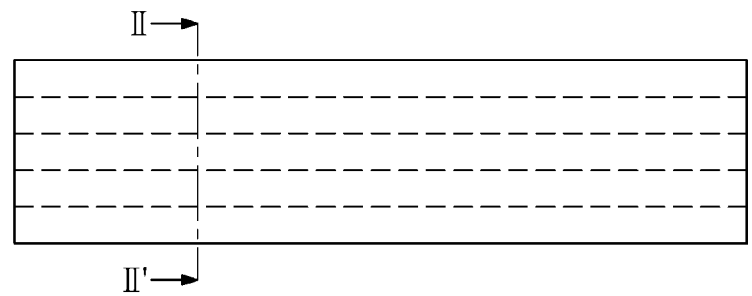
FIG. 4A is a plan view for explaining a rail plate of the piezoelectric device according to an embodiment.
Figure 4A:
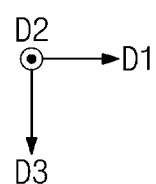
Figure 4B:
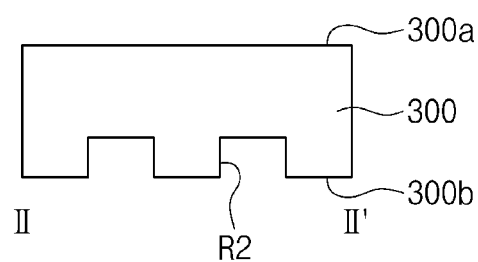
FIG. 4B is a cross-sectional view taken along line of FIG. 4A.
Figure 4B:
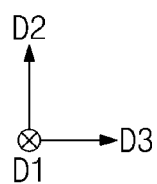
Figure 5A:
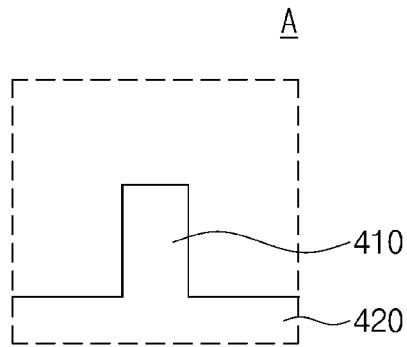
FIGS. 5A to 5E are enlarged views illustrating area A of FIG. 1A for explaining a displacement transmission structure of the piezoelectric device according to embodiments.
Figure 5B:
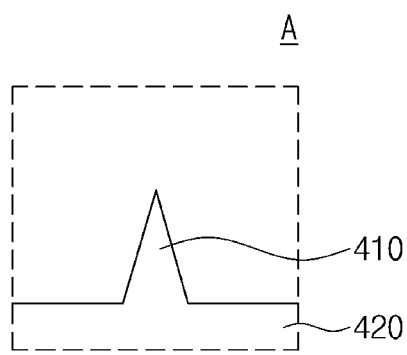
Figure 5C:
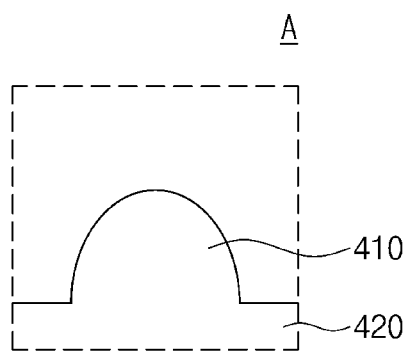
Figure 5D:
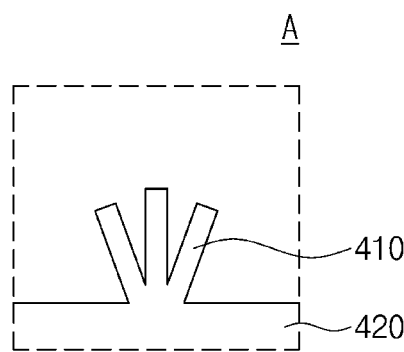
Figure 5E:
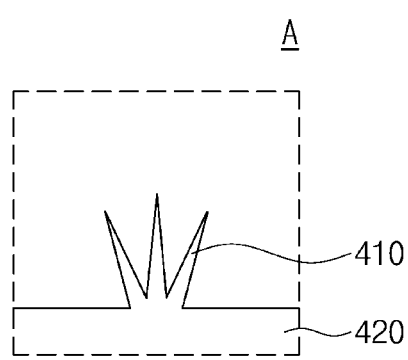

FIG. 4A is a plan view for explaining the rail plate of the piezoelectric device according to an embodiment. FIG. 4B is a cross-sectional view taken along line of FIG. 4A.

Referring to FIGS. 4A and 4B in conjunction with FIG. 1A, the rail plate 300 may be disposed on the displacement amplification structure 200. More particularly, the rail plate 300 may be bonded on a bottom surface of the displacement transmission structure 400 and disposed between the displacement transmission structure 400 and the displacement amplification structure 200. The rail plate 300 may have a groove R2. The groove R2 may be obtained such that a bottom surface of the rail plate 300 is recessed toward a top surface of the rail plate 300. The groove R2 may extend parallel to the first direction D1. The groove R2 may extend from the first moving part 251 to the second moving part 252. The first moving part 251 and the second moving part 252 may be disposed in the groove R2. The groove R2 may be provided in plurality. The grooves R2 may be spaced apart from each other in the third direction D3. The first moving part 251 and the second moving part 252 may move along the grooves R2. The grooves R2 may define a movement path of the first moving part 251 to the second moving part 252 when the piezoelectric device according to an embodiment of the inventive concept operates.

Figure 2:
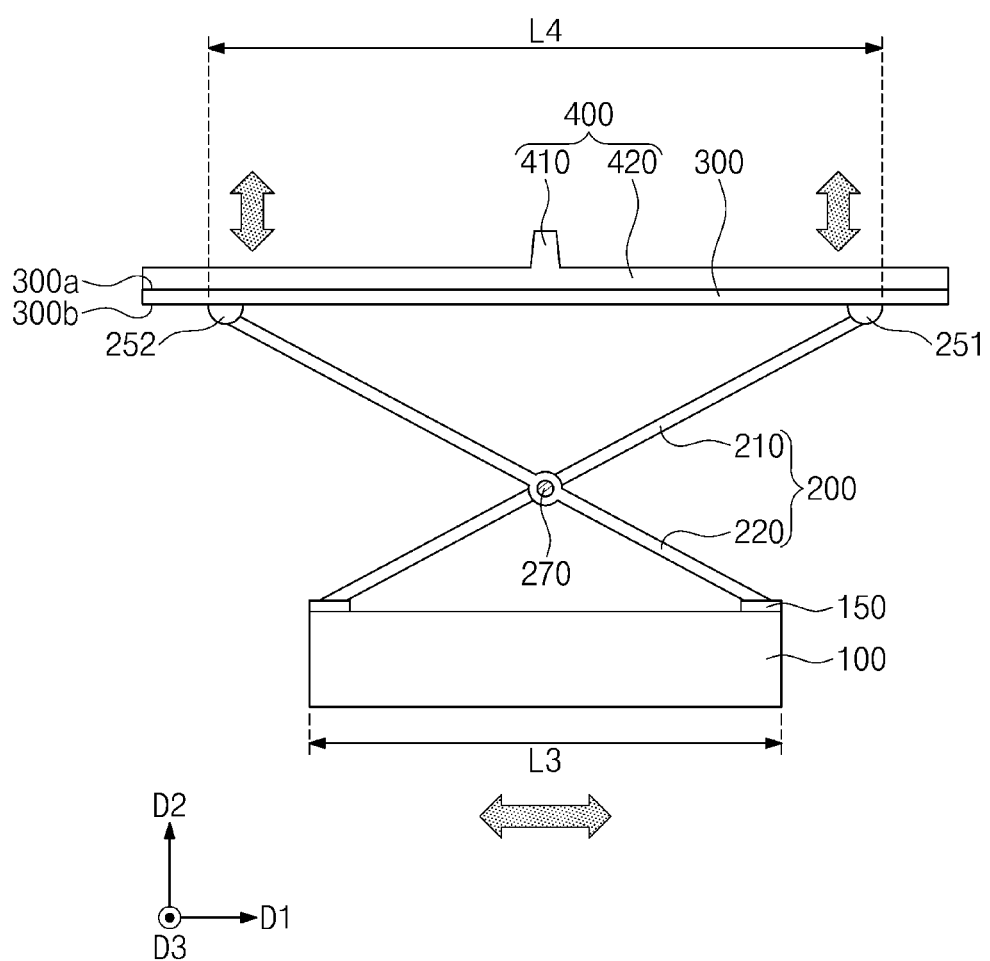
FIG. 2 is a cross-sectional view for explaining a state in which the piezoelectric device according to an embodiment operates.

FIG. 2 is a cross-sectional view for explaining a state in which the piezoelectric device according to an embodiment operates. Hereinafter, an operation of the piezoelectric device according to an embodiment of the inventive concept will be described.

Referring to FIG. 2 in conjunction with FIG. 1A, a current may be supplied from an external power device (not shown) to the piezoelectric actuator 100. The piezoelectric actuator may vibrate while repeating contraction and expansion by the supplied current. The vibration may be parallel to the first direction D1 and the opposite direction of the first direction D1. That is, the vibration may vibrate in a horizontal direction. The displacement amplification structure 200 may convert a vibration in the horizontal direction into a vibration in a vertical direction. Since one end of the first displacement amplification structure 210 and one end of the second displacement amplification structure 220 are fixed to the piezoelectric actuator 100 by the fixing parts 150, when the piezoelectric actuator 100 vibrates, the first displacement amplification structure 210 and the second displacement amplification structure 220 may also move together.

For example, when a third distance L3 between the fixing parts 150 decreases as the piezoelectric actuator 100 is contracted, each of the first displacement amplification structure 210 and the second displacement amplification structure 220 may rotate with respect to the fixing pin 270. The first moving part 251 bonded to the other end of the first displacement amplification structure 210 and the second moving part 251 bonded to the other end of the second displacement amplification structure 220 may move along the groove R2 of the rail plate 300. Thus, a fourth distance L4 between the first moving part 251 and the second moving part 252 may decrease. Each of the first angle θ1 between the first displacement amplification structure 210 and the bottom surface of the rail plate 300 and the second angle θ2 between the second displacement amplification structure 220 and the bottom surface of the rail plate 300 may increase, and a first height HT1 of the displacement amplification structure 200 may increase. The first height HT1 may be a distance from the piezoelectric actuator 100 to the rail plate 300.

For another example, when the third distance L3 between the fixing parts 150 increases as the piezoelectric actuator 100 is expanded, the fourth distance L4 between the first moving part 251 and the second moving part 252 may increase. Each of the first angle θ1 between the first displacement amplification structure 210 and the bottom surface of the rail plate 300 and the second angle θ2 between the second displacement amplification structure 220 and the bottom surface of the rail plate 300 may decrease, and the first height HT1 of the displacement amplification structure 200 may decrease. Through repetition of the above-described operation, the vibration in the horizontal direction of the piezoelectric actuator 100 may be transmitted to the outside as the vibration in the vertical direction through the displacement transmission structure 400

Referring to FIG. 1A again, according to an embodiment of the inventive concept, a first distance L1 from the fixing pin 270 to one end of the first displacement amplification structure 210 may be different from a second distance L2 from the fixing pin 270 to the other end of the first displacement amplification structure 210. Hereinafter, a description will be described based on the first displacement amplification structure 210 because the second displacement amplification structure 220 has a structure symmetric with the first displacement amplification structure 210. For example, the first distance L1 may be less than the second distance L2. In this case, the displacement amplification structure 200 may amplify a horizontal displacement caused by a micro-vibration of the piezoelectric actuator into a vertical displacement based on the principle of the lever. More particularly, a variation amount of the third distance L3 caused by contraction and expansion of the piezoelectric actuator may be less than that of the first height HT1. When only micro-vibration is generated as a low voltage is applied to the piezoelectric actuator 100, the piezoelectric device including the displacement amplification structure 200 according to an embodiment of the inventive concept may amplify the micro-vibration and output strong vibration through the displacement transmission structure 400. Thus, the piezoelectric device that is effectively driven even at low voltage may be provided.

FIGS. 5A to 5E are enlarged views illustrating area A of FIG. 1A for explaining the displacement transmission structure of the piezoelectric device according to embodiments.

Referring to FIGS. 5A to 5E in conjunction with FIG. 1A, the displacement transmission structure 400 may be disposed on the rail plate 300. The displacement transmission structure 400 may be fixed on a top surface 300a of the rail plate 300. The displacement transmission structure 400 may include a protruding part 410 and a flat part 420. The flat part 420 may be parallel to the top surface of the piezoelectric actuator 100. The flat part 420 may extend in parallel to the top surface 300a of the rail plate 300. In terms of a plane, the flat part 420 may overlap the rail plate 300. Side surfaces of the flat part 420 may be vertically aligned with side surface of the rail plate 300.

The protruding part 410 may be disposed on the flat part 420. The protruding part 410 may be a portion protruding from the flat part 420 in the second direction D2. The protruding part 410 may be connected to a central portion of the flat part 420. The vertical vibration of the displacement transmission structure 400, which is generated by the vibration of the piezoelectric actuator 100, may be transmitted to the outside through the protruding part 410. A cross-section of the protruding part 410 may have various shapes. For example, the cross-section of the protruding part 410 may have a polygonal shape as in FIGS. 1A and 5A, and more particularly, have a trapezoidal shape or a rectangular shape. For another example, the cross-section of the protruding part 410 may have a semispherical shape or a semielliptical shape. For another example, the cross-section of the protruding part 410 may have a shape in which a plurality of pins are radially connected as in FIGS. 5D and 5E. However, the embodiment of the inventive concept is not limited to the cross-section of the protruding part 410 in FIGS. 5A to 5E. The cross-section of the protruding part 410 may be variously deformed.

Figure 6:
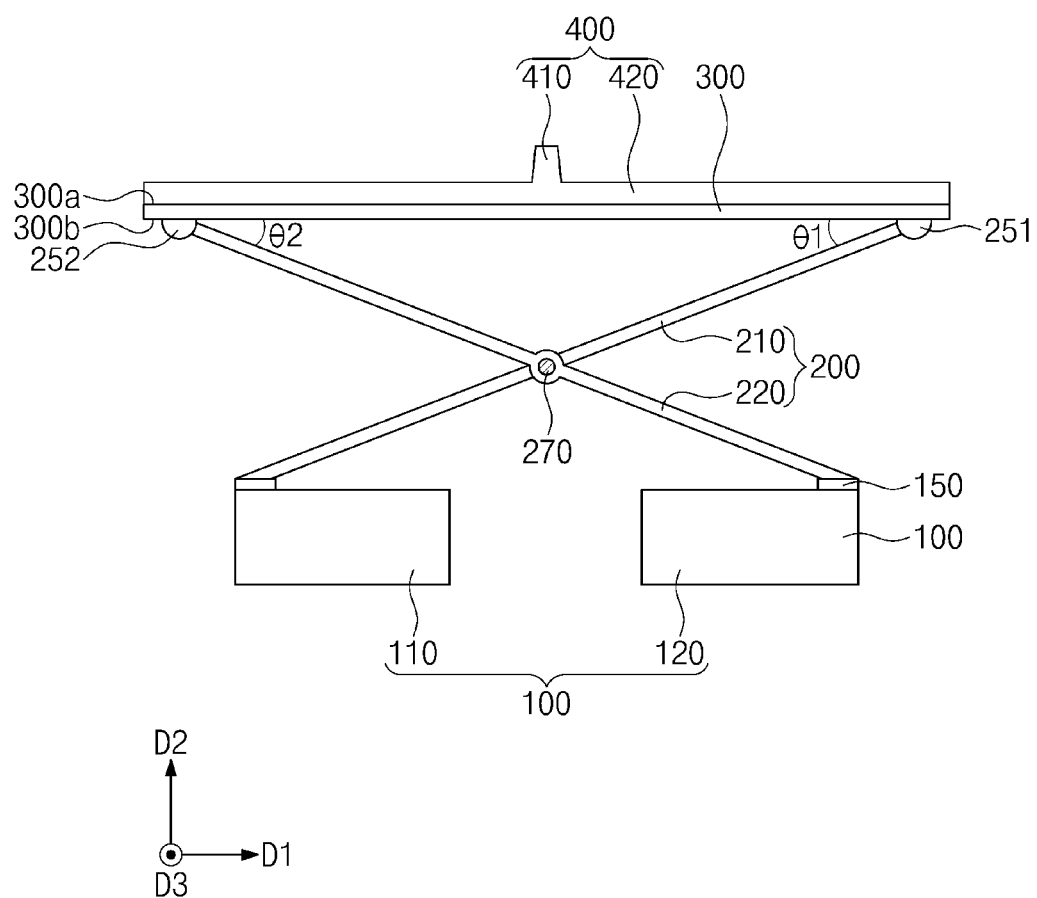
FIG. 6 is a cross-sectional view for explaining a piezoelectric device according to another embodiment of the inventive concept.

FIG. 6 is a cross-sectional view for explaining a piezoelectric device according to another embodiment of the inventive concept.

Referring to FIG. 6, the piezoelectric device according to another embodiment of the inventive concept may include a piezoelectric actuator 100, a displacement amplification structure 200, fixing parts 150, moving parts 251 and 252, a rail plate 300, and a displacement transmission structure 400. The displacement amplification structure 200, the fixing parts 150, the moving parts 251 and 252, the rail plate 300, and the displacement transmission structure 400 may be substantially the same as features described in FIG. 1A. Hereinafter, overlapped features described above will be omitted, and different points will be described in detail.

The piezoelectric actuator 100 may be provided. The piezoelectric actuator 100 may include a first piezoelectric actuator 110 and a second piezoelectric actuator 120. The first piezoelectric actuator 110 and the second piezoelectric actuator 120 may be spaced apart from each other in the first direction D1. The first piezoelectric actuator 110 and the second piezoelectric actuator 120 may not be electrically connected to each other. Thus, the first piezoelectric actuator 110 and the second piezoelectric actuator 120 may be independently driven. For example, the number of vibration of the first piezoelectric actuator 110 may be different from that of the second piezoelectric actuator 120, and intensity of the vibration of the first piezoelectric actuator 110 may be different from that of the second piezoelectric actuator 120.

One end of the first displacement amplification structure 210 may be fixed to a top surface of the first piezoelectric actuator 110 by one of the fixing parts 150. One end of the second displacement amplification structure 220 may be fixed to a top surface of the second piezoelectric actuator 120 by the other of the fixing parts 150. Since the first piezoelectric actuator 110 and the second piezoelectric actuator 120 vibrate differently from each other, the first displacement amplification structure 210 and the second displacement amplification structure 220 may also move differently from each other. More particularly, a first angle θ1 between the first displacement amplification structure 210 and a bottom surface 300b of the rail plate 300 may be different from a second angle θ2 between the second displacement amplification structure 220 and the bottom surface 300b of the rail plate 300. Thus, as the displacement transmission structure 400 vibrates in an inclined state, the piezoelectric device capable of vibrating in various directions may be provided.

Figure 7:
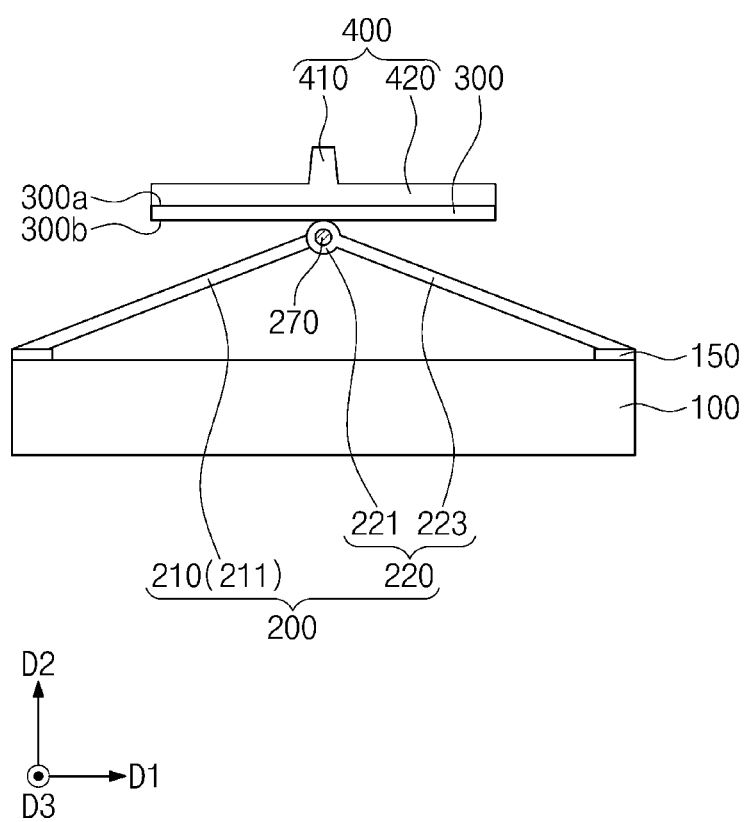
FIG. 7 is a cross-sectional view for explaining a piezoelectric device according to another embodiment of the inventive concept.

FIG. 7 is a cross-sectional view for explaining a piezoelectric device according to another embodiment of the inventive concept.

Referring to FIG. 7, the piezoelectric device according to another embodiment of the inventive concept may include a piezoelectric actuator 100, a displacement amplification structure 200, fixing parts 150, a rail plate 300, and a displacement transmission structure 400. The piezoelectric actuator 100, the fixing parts 150, and the displacement transmission structure 400 may be substantially the same as the features described in FIG. 1A. Hereinafter, overlapped features described above will be omitted, and different points will be described in detail.

The displacement amplification structure 200 may be disposed on the piezoelectric actuator 100. The displacement amplification structure 200 may be fixed on the piezoelectric actuator 100 through the fixing parts 150. The displacement amplification structure 200 may include a first displacement amplification structure 210 and a second displacement amplification structure 220. The first displacement amplification structure 210 may include a first portion 211 and a second portion 213. The first displacement amplification structure 210 may have a shape in which one of one pair of second portions 213 is omitted from the first displacement amplification structure 210 of FIG. 1A. The second displacement amplification structure 220 may have the same shape as the first displacement amplification structure 210. The second displacement amplification structure 220 may include a first portion 221 and a second portion 223. The fixing pin 270 may pass through the first portion 211 of the first displacement amplification structure 210 and the first portion 221 of the second displacement amplification structure 220. Thus, the fixing pin 270 may couple the first displacement amplification structure 210 and the second displacement amplification structure 220. More particularly, the second portion 213 of the first displacement amplification structure 210 and the second portion 223 of the second displacement amplification structure 220 may be fixed on the piezoelectric actuator 100 by the fixing parts 150. The first portion 211 of the first displacement amplification structure 210 and the first portion 221 of the second displacement amplification structure 220 may be bonded on a rear surface of the rail plate 300. When the piezoelectric actuator 100 vibrates, each of the first displacement amplification structure 210 and the second displacement amplification structure 220 may rotate with respect to the fixing pin 270. An angle between the second portion 213 of the first displacement amplification structure 210 and the second portion 223 of the second displacement amplification structure 220 may be varied. Thus, the displacement transmission structure 400 may vertically vibrate. According to an embodiment of the inventive concept, the first portion 211 of the first displacement amplification structure 210 and the second portion 221 of the second displacement amplification structure 220 may be directly bonded to the rail plate 300 to reduce a height of the displacement amplification structure 200. Thus, as a volume of the piezoelectric device is reduced, high integration of the piezoelectric device in an electronic apparatus may be implemented.

Figure 8:
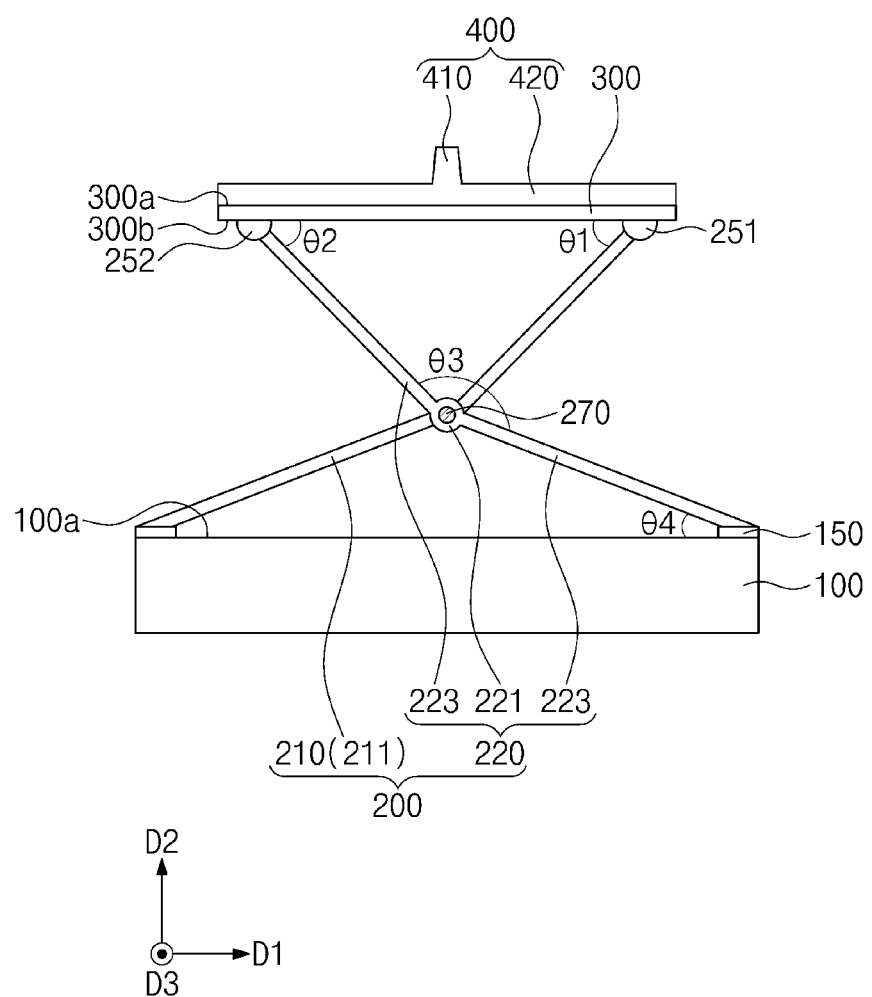
FIG. 8 is a cross-sectional view for explaining a piezoelectric device according to another embodiment of the inventive concept.

FIG. 8 is a cross-sectional view for explaining a piezoelectric device according to another embodiment of the inventive concept.

Referring to FIG. 8, the piezoelectric device according to another embodiment of the inventive concept may include a piezoelectric actuator 100, a displacement amplification structure 200, fixing parts 150, a rail plate 300, and a displacement transmission structure 400. The piezoelectric actuator 100, the fixing parts 150, and the displacement transmission structure 400 may be substantially the same as the features described in FIG. 1A. Hereinafter, overlapped features described above will be omitted, and different points will be described in detail.

The displacement amplification structure 200 may include a first displacement amplification structure 210 and a second displacement amplification structure 220. The second displacement amplification structure 220 may include a first portion 221 and one pair of second portions 223. The one pair of second portions 223 may not be parallel to each other with respect to the first portion 221. More particularly, a third angle θ3 between the one pair of second portions 223 may be in a range from about 90° to about 180°. A second angle θ2 between the second portion 223 of the second displacement amplification structure 220 and a bottom surface 300b of the rail plate 300 may be in a range from about 45° to about 90°, and a fourth angle θ4 between the second portion 223 of the second displacement amplification structure 220 and a top surface 100a of the piezoelectric actuator 100 may be in a range from about 10° to about 45°. The second angle θ2 may be greater than the fourth angle θ4. The first displacement amplification structure 210 may include a first portion 211 and one pair of second portions 213. The one pair of second portions 213 of the first displacement amplification structure 210 may be substantially the same as the one pair of second portions 223 of the second displacement amplification structure 220. In the piezoelectric device according to another embodiment of the inventive concept, as the one pair of second portions 213 and 223 of each of the first displacement amplification structure 210 and the second displacement amplification structure 220 are bent with respect to the fixing pin 270, the displacement transmission structure 400 may transmit vibration having a further great amplitude in the second direction D2 when the piezoelectric device operates. Thus, the piezoelectric device outputting high vibration sensitivity even at low voltage may be provided.

Figure 9:
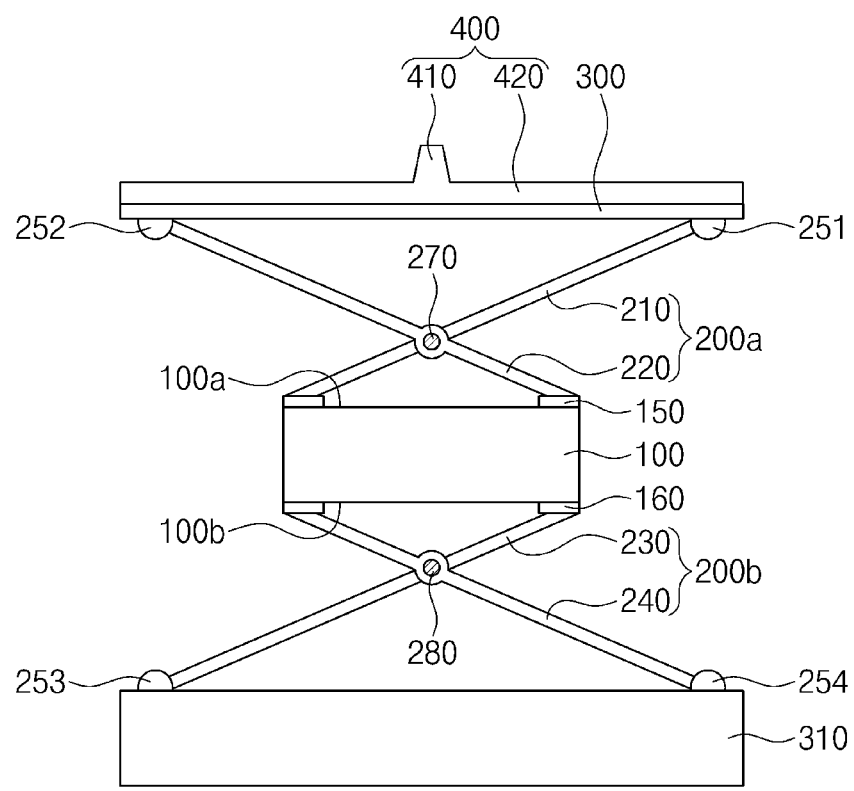
FIG. 9 is a cross-sectional view for explaining a piezoelectric device according to another embodiment of the inventive concept.

FIG. 9 is a cross-sectional view for explaining a piezoelectric device according to another embodiment of the inventive concept.

Referring to FIG. 9, the piezoelectric device according to another embodiment of the inventive concept may further include a lower displacement amplification structure 200*b*, lower fixing parts 160, and a lower rail plate 310 in addition to a piezoelectric actuator 100, an upper displacement amplification structure 200*a*, upper fixing parts 150, an upper rail plate 300*a*, and a displacement transmission structure 400. The piezoelectric actuator 100, the upper displacement amplification structure 200*a*, the upper fixing parts 150, the upper rail plate 300*a*, and the displacement transmission structure 400 may be substantially the same as the piezoelectric actuator 100, the displacement amplification structure 200, the fixing parts 150, the rail plate 300, and the displacement transmission structure 400 in FIG. 1A, respectively. Hereinafter, overlapped features described above will be omitted, and different points will be described in detail.

A second rail plate 300*b* may be disposed on a bottom surface 100*b* of the piezoelectric actuator 100. A lower rail plate 310 may be substantially the same as the upper rail plate 300*a*. The lower rail plate 310 may have grooves. A lower displacement amplification structure 200*b* may be disposed between the lower rail plate 310 and the bottom surface 100*b* of the piezoelectric actuator 100. The lower displacement amplification structure 200*b* may be fixed on the bottom surface 100*b* of the piezoelectric actuator 100 by the lower fixing parts 160. The lower displacement amplification structure 200*b* may include a first lower displacement amplification structure 230 and a second lower displacement amplification structure 240. The lower displacement amplification structure 200*b* may be substantially the same as the displacement amplification structure 200 described in FIG. 1A. One end of the first lower displacement amplification structure 230 may be fixed on the bottom surface 100*b* of the piezoelectric actuator 100 by the lower fixing parts 160. Third moving parts 253 may be bonded to the other end of the first lower displacement amplification structure 230. The third moving parts 253 may be disposed in grooves of the lower rail plate 310, respectively. One end of the second lower displacement amplification structure 240 may be fixed on the bottom surface 100*b* of the piezoelectric actuator 100 by the lower fixing parts 160. Fourth moving parts 254 may be bonded to the other end of the second lower displacement amplification structure 240. The fourth moving parts 254 may be disposed in the grooves of the lower rail plate 310, respectively. The lower displacement amplification structure 200*b* may be disposed symmetrically with the upper displacement amplification structure 200*a* with respect to the piezoelectric actuator 100. When the piezoelectric actuator 100 operates and vibrates, the upper displacement amplification structure 200*a* and the lower displacement amplification structure 200*b*, which are fixed to the piezoelectric actuator 100, may move together. Thus, when the vibration of the piezoelectric actuator 100 has a tiny amplitude as a low voltage is applied, the amplitude of the vibration may be effectively amplified.

The piezoelectric device according to the embodiment of the inventive concept may include the displacement amplification structure disposed between the piezoelectric actuator and the displacement transmission structure. The displacement amplification structure may include the first displacement amplification structure and the second displacement amplification structure. The displacement amplification structure may have a scissor-hinge structure having a X-shape and amplify and convert the left-right displacement generated by the piezoelectric actuator into the vertical displacement by using the principle of the lever. Thus, the piezoelectric device that is effectively driven even at low voltage may be provided.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Thus, the above-disclosed embodiments are to be considered illustrative and not restrictive.

What is claimed is:

1. A piezoelectric device comprising:
a piezoelectric actuator;
a displacement transmission structure disposed on the piezoelectric actuator; and
a displacement amplification structure disposed between the piezoelectric actuator and the displacement transmission structure,
wherein the displacement amplification structure comprises:
a first displacement amplification structure and a second displacement amplification structure, which cross each other; and
a fixing pin that passes through the first displacement amplification structure and the second displacement amplification structure to connect the first displacement amplification structure and the second displacement amplification structure,
wherein each of one end of the first displacement amplification structure and one end of the second displacement amplification structure is fixed on the piezoelectric actuator.

2. The piezoelectric device of claim 1, wherein the fixing pin passes through each of the first displacement amplification structure and the second displacement amplification structure at a first point at which the first displacement amplification structure and the second displacement amplification structure cross each other.

3. The piezoelectric device of claim 1, further comprising:
a first moving part bonded to the other end of the first displacement amplification structure;
a second moving part bonded to the other end of the second displacement amplification structure; and
a rail plate disposed on the first moving part and the second moving part.

4. The piezoelectric device of claim 3, wherein the rail plate has a plurality of grooves extending from the first moving part to the second moving part on a bottom surface thereof.

5. The piezoelectric device of claim 3, wherein the rail plate has a plurality of grooves on a bottom surface thereof,
wherein the plurality of grooves define a movement path of each of the first moving part and the second moving part.

6. The piezoelectric device of claim 1, further comprising a rail plate disposed between the displacement amplification structure and the displacement transmission structure,
wherein a first angle between the first displacement amplification structure and a bottom surface of the rail plate is equal to a second angle between the second displacement amplification structure and the bottom surface of the rail plate.

7. The piezoelectric device of claim 1, wherein a first distance from the fixing pin to the one end of the first displacement amplification structure is less than a second distance from the fixing pin to the other end of the first displacement amplification structure.

8. The piezoelectric device of claim 1, wherein the displacement transmission structure comprises a flat part parallel to a top surface of the piezoelectric actuator and a protruding part that protrudes from the flat part.

9. The piezoelectric device of claim 8, wherein a vertical cross-section of the protruding part has a polygonal shape, a semispherical shape, or a semielliptical shape.

10. The piezoelectric device of claim 1, wherein the piezoelectric actuator comprises a first piezoelectric actuator and a second piezoelectric actuator, which are horizontally spaced apart from each other,
wherein the one end of the first displacement amplification structure is fixed to the first piezoelectric actuator, and
the one end of the second displacement amplification structure is fixed to the second piezoelectric actuator.

11. The piezoelectric device of claim 10, wherein the first piezoelectric actuator and the second piezoelectric actuator are not electrically connected to each other and are configured to vibrate independently.

12. The piezoelectric device of claim 1, wherein the second displacement amplification structure comprises a first portion and one pair of second portions,
wherein an angle between the one pair of second portions is in a range from about 90° to about 180°.

13. The piezoelectric device of claim 12, further comprising a rail plate disposed between the second displacement amplification structure and the displacement transmission structure,
wherein an angle between one of the second portions of the second displacement amplification structure, which is adjacent to the rail plate, and the rail plate is in a range from about 45° to about 90°, and
an angle between the other of the second portions of the second displacement amplification structure, which is adjacent to the piezoelectric actuator, and the piezoelectric actuator is in a range from about 10° to about 45°.

14. The piezoelectric device of claim 1, further comprising:
a lower rail plate disposed on a bottom surface of the piezoelectric actuator and comprising a plurality of grooves; and
a lower displacement amplification structure disposed between the lower rail plate and the piezoelectric actuator,
wherein the lower displacement amplification structure comprises a first lower displacement amplification structure and a second lower displacement amplification structure, which cross each other, and
one end of the first lower displacement amplification structure and one end of the second lower displacement amplification structure are fixed on the bottom surface of the piezoelectric actuator.

15. The piezoelectric device of claim 14, further comprising:
a third moving part bonded to the other end of the first lower displacement amplification structure; and
a fourth moving part bonded to the other end of the second lower displacement amplification structure,
wherein each of the third moving part and the fourth moving part moves along the plurality of grooves of the lower rail plate.

* * * * *